United States Patent [19]
Aritome et al.

[11] Patent Number: 6,049,482
[45] Date of Patent: Apr. 11, 2000

[54] NON-VOLATILE SEMICONDUCTOR MEMORY DEVICE

[75] Inventors: Seiichi Aritome; Kazuhiro Shimizu, both of Yokohama, Japan

[73] Assignee: Kabushiki Kaisha Toshiba, Kawasaki, Japan

[21] Appl. No.: 09/217,015

[22] Filed: Dec. 21, 1998

[30] Foreign Application Priority Data

Dec. 25, 1997 [JP] Japan ................................. 9-357340

[51] Int. Cl.$^7$ ................................................. G11C 11/34
[52] U.S. Cl. ................................. 365/185.24; 365/185.17
[58] Field of Search ......................... 365/185.18, 185.24, 365/185.17

[56] References Cited

U.S. PATENT DOCUMENTS 5,877,524  3/1999  Oonakado ......................... 365/185.18

FOREIGN PATENT DOCUMENTS 6097455  4/1994  Japan .

Primary Examiner—A. Zarabian
Attorney, Agent, or Firm—Loeb & Loeb, LLP

[57] ABSTRACT

A non-volatile semiconductor memory device includes a memory cell array constituted of a plurality of memory cell units arranged on a semiconductor substrate in rows and columns, each of the memory cell units is constituted of a plurality of electrically rewritable memory cells connected to each other, and has a selective transistor at one end, and a plurality of bit lines arranged in parallel in a column direction and connected to corresponding one of the memory cell units at the one end of the memory cell unit, and a selective gate line connected to a gate of the selective transistor. In data writing operation, the voltage Vsg of the selective gate line is set at a voltage which is higher than an external power supply voltage and satisfies the relationship Vth(0)<Vsg<Vbit+Vth(−Vbit) (wherein Vth(x) is the threshold voltage of the selective transistor when a semiconductor substrate surface in which the memory cell array is formed is applied with x volt, and Vbit is a voltage applied to non-select bit lines among the plurality of bit lines). In this manner, the non-volatile semiconductor memory device sets the voltage Vbit higher than the external power supply voltage.

20 Claims, 12 Drawing Sheets

NON-VOLATILE SEMICONDUCTOR MEMORY DEVICE

BACKGROUND OF THE INVENTION

This invention relates to a non-volatile semiconductor memory device, in particular, a writing method of a non-volatile semiconductor memory device having a memory cell unit constituted of a plurality of memory cells which are connected to each other and each have a FETMOS structure.

In recent years, there has been developed a non-volatile semiconductor memory device wherein one memory cell unit constituted of a plurality of electrically rewritable EEPROM cells is connected to a data line. According to the non-volatile semiconductor memory device having such a structure, the number of contacts of the cells to the data line can be reduced, thereby the integration density can be increased.

In such a device, one memory cell has a FETMOS structure provided with a floating gate and a control gate formed on a semiconductor substrate so as to hold an insulating film therebetween. Adjacent memory cells are connected in series so as to share source and drain electrodes, thereby constitute a NAND cell. A memory cell array is attained by arranging a plurality of such NAND cells in matrix.

The drain electrode located on the side of one terminal of each of the NAND cells arranged in the column direction of the cell array is connected to a bit line via a selective transistor having a selective gate, and the source electrode located on the side of another one terminal of each of the NAND cells connected to a common source line via a selective transistor having a selective gate. The control gates and selective gates of the memory cells are respectively connected in common, as a control gate line (word line) and a selective gate line, in a row direction of the memory cell array.

On the other hand, a voltage applied to the bit line and a voltage applied to the gate of the selective transistor have been lowered in recent years in accordance with the decrease of an external power supply voltage Vcc. Accordingly, a voltage transferred in data writing to the diffusion layer of the memory cell is lowered, thereby a writing error may easily occur.

The operation of the above-mentioned NAND cell will be described later in detail. If a voltage applied to a non-write bit line is lowered, thereby the selective transistor which is connected to a non-select bit line and should be cut-off cannot be easily cut-off. Further, when an element isolation film is formed by the STI (Shallow Trench Isolation), an impurity concentration of a channel region is lowered in comparing with that of the device having an element isolation film formed by a LOCOS (Local Oxidation of Silicon), thereby the backgating effect of the selected transistor is decreased. As a result, the cut-off of the selective transistor is made to be difficult more and more, thereby a writing error will easily occur.

BRIEF SUMMARY OF THE INVENTION

The object of the present invention is to provide a non-volatile semiconductor memory device capable of preventing a writing error from occurring even if voltages applied to the bit line and the selective gate line are lowered or the STI structure is employed to form an element isolation film.

The above-mentioned object of the present invention are attained by the non-volatile semiconductor memory device according to the first aspect of the present invention comprising: a semiconductor substrate; a memory cell array formed on the semiconductor substrate, the memory cell array comprising a plurality of memory cell units arranged in rows and columns, each of the memory cell units being constituted of a plurality of electrically rewritable memory cells connected to each other, each of the memory cell units having a first selective transistor at one end; a plurality of data lines arranged in parallel substantially in a column direction, each of the data lines being connected to corresponding memory cell units at the one end of each of the memory cell units; and a selective gate line connected to a gate of the first selective transistor, the non-volatile semiconductor memory device executing an operation wherein, during data writing operation of writing data in selected one of the memory cells constituting selected one of the memory cell units connected to selected one of the data lines, a voltage Vsg of the selective gate line is set at a certain voltage which is higher than an external power supply voltage and satisfies a relationship $$Vth(0) < Vsg < Vbit + Vth(-Vbit)$$

where Vth(x) is a threshold voltage of the first selective transistor in applying x volt to a semiconductor substrate surface on which the memory cell array is formed, and Vbit is a voltage applied to a non-select data line among the plurality of data lines, and the voltage Vbit is set at a voltage higher than the external power supply voltage.

The above-mentioned object of the present invention are also attained by the non-volatile semiconductor memory device according to the second aspect of the present invention comprising: a semiconductor substrate; a memory cell array formed on the semiconductor substrate, the memory cell array comprising a plurality of memory cell units arranged in rows and columns, each of the memory cell units being constituted of a plurality of electrically rewritable memory cells connected to each other, each of the memory cell units having a first selective transistor at one end; a plurality of data lines arranged in parallel substantially in a column direction, each of the data lines being connected to corresponding memory cell units at the one end of each of the memory cell units; and a selective gate line connected to a gate of the first selective transistor, the non-volatile semiconductor memory device executing an operation wherein, during data writing operation of writing data in selected one of the memory cells constituting selected one of the memory cell units connected to selected one of the data lines, a voltage Vsg of the selective gate line is set at a certain voltage which satisfies a relationship $$Vth(Vwell) < Vsg < Vbit + Vth(-Vbit + Vwell)$$

where Vth(x) is a threshold voltage of the first selective transistor in applying x volt to a semiconductor substrate surface on which the memory cell array is formed, and Vbit is a voltage applied to nonselect data line among the plurality of data lines, and Vwell is a voltage of the semiconductor substrate surface on which the memory cell array is formed and satisfies Vwell<0.

It is preferable for the non-volatile semiconductor memory devices according to the first and the second aspects to include the following features.

The semiconductor memory device further executes an operation during the data writing operation, in which voltages of the bit lines are transferred to the memory cell units each via the first selective transistor before the voltage Vsg of the selective gate line is set at the certain voltage, by setting the voltage Vsg of the selective gate line at a high voltage higher than the voltage.

Each of the memory cells has a control gate which is applied with the high voltage during a beginning of the data writing operation.

The voltage Vsg is high enough to transfer a voltage of the selected one of the data lines to the selected one of the memory cell units.

The above-mentioned object of the present invention are also attained by a non-volatile semiconductor memory device according to the third aspect of the present invention, comprising: a semiconductor substrate; a memory cell array formed on the semiconductor substrate, the memory cell array comprising a plurality of memory cell units arranged in rows and columns, each of the memory cell units being constituted of a plurality of electrically rewritable memory cells connected to each other, the memory cell units having selective transistors at one ends, respectively; a plurality of bit lines arranged in parallel substantially in a column direction, each of the bit lines being connected to corresponding memory cell units at the one ends of the memory cell units; and a selective gate line connected to gates of the selective transistors, the non-volatile semiconductor memory device executing an operation wherein, during data writing operation of writing data in at least selected one of the memory cells constituting at least selected one of the memory cell units connected to at least selected one of the bit lines, a voltage Vsg of the selective gate line is set at a first voltage higher than a power supply voltage to transfer voltages of the bit lines to the memory cell units through the selective transistors, and the voltage Vsg of the selective gate line is set at a second voltage higher than the power supply voltage to cut off at least a part of the selective transistors, thereafter.

It is preferable to set a voltage of the semiconductor substrate surface on which the memory cell array is formed at a voltage lower than a ground potential when the voltage Vsg of the selective gate line is set at the second voltage.

The above-mentioned object of the present invention are also attained by a non-volatile semiconductor memory device according to the fourth aspect of the present invention, comprising: a semiconductor substrate; a memory cell array formed on the semiconductor substrate, the memory cell array comprising a plurality of memory cell units arranged in rows and columns, each of the memory cell units being constituted of a plurality of electrically rewritable memory cells connected to each other, the memory cell units having selective transistors at one ends, respectively; a plurality of bit lines arranged in parallel substantially in a column direction, each of the bit lines being connected to corresponding memory cell units at the one ends of the memory cell units; and a selective gate line connected to a gate of the selective transistors, the non-volatile semiconductor memory device executing an operation wherein, during data writing operation of writing data in at least selected one of the memory cells constituting at least selected one of the memory cell units connected to at least selected one of the bit lines, after transferring voltages of the bit lines to the memory cell units through the selective transistors, a voltage of the selective gate line is set higher than a power supply voltage and a voltage of a semiconductor substrate surface on which the memory cell array is formed is set lower than a ground potential to cut off at least a part of the selective transistors.

It is preferable for the non-volatile semiconductor memory devices according to the third and the fourth aspects to include the following features.

A voltage of a non-write bit line among the bit lines is set higher than the power supply voltage.

The second voltage is high enough to transfer the voltage of the selected one of bit lines to the corresponding one of the memory cell units.

The above-mentioned object of the present invention are also attained by a non-volatile semiconductor memory device according to the fifth aspect of the present invention, comprising: a semiconductor substrate; a memory cell array formed on the semiconductor substrate, the memory cell array comprising a plurality of memory cell units arranged in rows and columns, each of the memory cell units being constituted of a plurality of electrically rewritable memory cells connected to each other, each of the memory cell units having a first selective transistor at one end; a plurality of data lines arranged in parallel substantially in a column direction, each of the data lines being connected to corresponding memory cell units at the one end of the memory cell unit; a selective gate line connected to a gate of the first selective transistor; and a substrate potential controller for setting a voltage of the semiconductor substrate as a negative voltage, the non-volatile semiconductor memory device executing an operation wherein a select data line among the data lines is applied with a voltage insufficient for cutting off the first selective transistor, and a non-select data line among the data lines is each applied with a voltage for cutting off the first selective transistor to simultaneously write a plurality of data in the memory cells.

It is preferable for the non-volatile semiconductor memory devices according to the first to the fifth aspects to include the following features.

Each of the memory cell units has a second selective transistor at the other end thereof.

The memory cells constituting each of the memory cell units are connected in series to constitute a NAND type memory cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Prior to the description of the embodiments, the operations of the NAND cell and the writing error which may occur in data writing will be described below.

Figure 1:
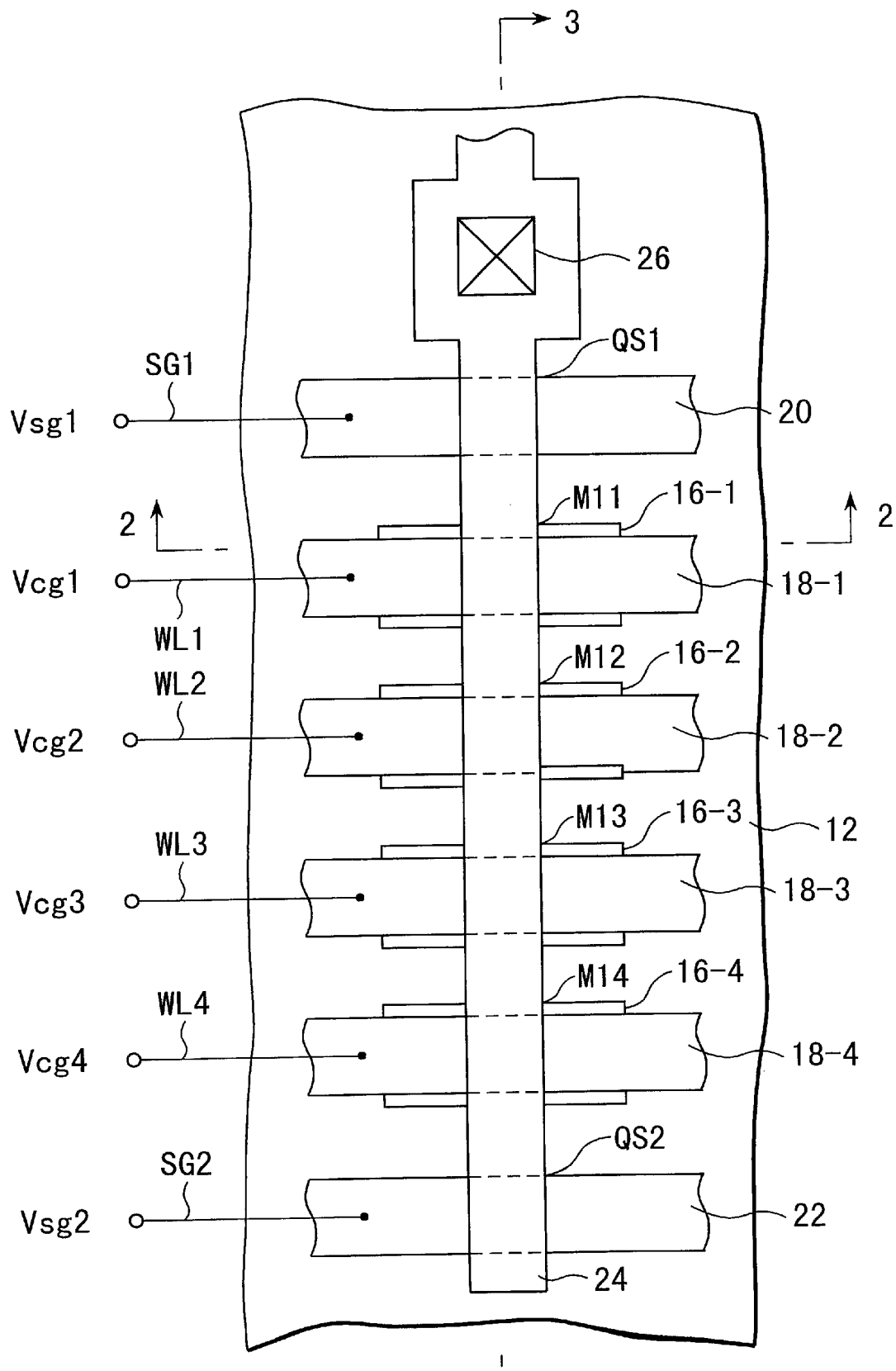
FIG. 1 is a schematic plane view of a NAND cell.
Figure 2:
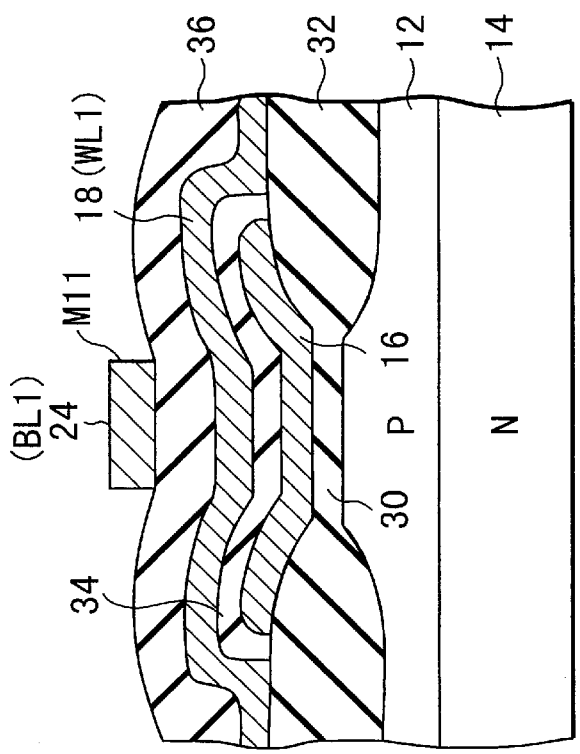
FIG. 2 is a sectional view of the NAND cell of FIG. 1, taken along a line 2—2.
Figure 3:
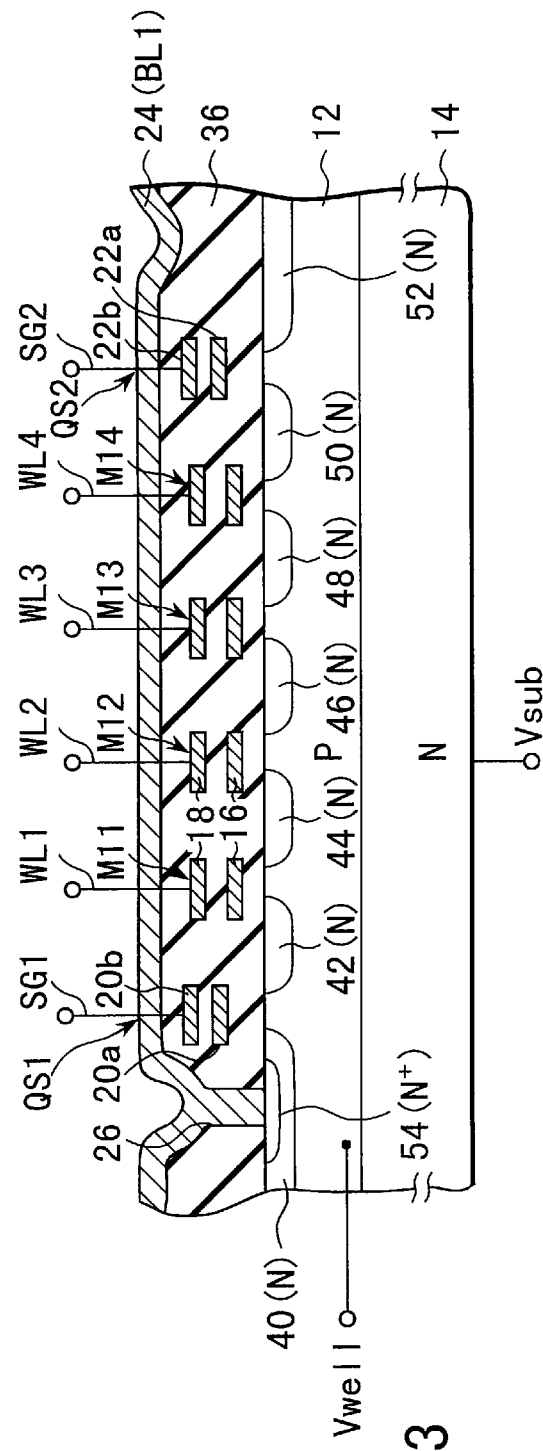
FIG. 3 is a sectional view of the NAND cell of FIG. 1, taken along a line 3—3.

FIG. 1 is a schematic plane view of a NAND cell constituted of a plurality of EEPROM cells, and FIGS. 2 and 3 are sectional views of the NAND cell of FIG. 1, taken along a line 2—2 and a line 3—3 respectively. Hereinafter, like reference numerals are used to designate like portions throughout the drawings for simplicity of illustration.

As shown in FIGS. 1, 2, and 3, the NAND cell is provided with, for example, a p-type well 12 formed in a n-type silicon substrate 14, and an element isolation film 32 formed selectively in a surface region of the p-type well 12.

There are provided in a region surrounded by the element isolation film 32, a NAND cell comprising, for example, memory cells M11–M14 each comprising four EEPROM cells, and two selective transistors QS1 and QS2.

In each of the memory cells constituting the NAND cell, a first gate insulating film 30 is formed on the p-type well 12 surrounded by the element isolation film 32, and a floating gate 16 (16-1, 16-2, 16-3, and 16-4) made of a polycrystalline silicon film, for example, is formed on the first gate insulating film 30. Further, a second gate insulating film 34 is formed on the floating gate 16, and a control gate 18 (18-1, 18-2, 18-3, and 18-4) made of a polycrystalline silicon film, for example, is formed on the second gate insulating film 34.

In the selective transistors QS1 and QS2, a gate insulating film is formed on the p-type well 12, and gate electrodes 20 and 22 are formed of poly-crystalline silicon on the gate insulating film. The gate electrodes 20 and 22 respectively have first layers 20a and 22a formed simultaneously with the floating gate 16, and have second layers 20b and 22b formed simultaneously with the control gate 18, as shown in FIG. 3. The gate electrodes 20 and 22 are respectively connected to the first layers 20a and 22a and the second layers 20b and 22b in a predetermined portion (not shown).

As shown in FIG. 1, the control gates 18-1–18-4 of the memory cells are each formed in series in a row direction, and connected to the control gates of the adjacent NAND cells to form word lines WL1–WL4. The potentials of the word lines WL1–WL4 are denoted as Vcg1–Vcg4, respectively. The gate electrodes 20 and 22 of the selective transistors QS1 and QS2 are also formed in series in a row direction so as to form selective gate lines SG1 and SG2, respectively. The potentials of the selective gate lines SG1 and SG2 are denoted as Vsg1 and Vsg2.

As shown in FIG. 3, n-type diffusion layers 40, 42, 44, 46, 48, 50, and 52 as source and drain regions are formed in the p-type well 12. These n-type diffusion layers are shared by the adjacent memory cells, and shared by the memory cell and the selective transistor which are adjacent to each other. As a result, current paths of the selective transistor QS1, the memory cells M11–M14, and the selective transistor QS2 are connected in series, thereby a NAND cell is obtained. In a drain region 40 of the selective transistor QS1, a n$^+$type diffusion layer 54 is formed so as to be connected to a bit line (BL1) 24 as a data line through a contact hole 26. The source region 52 of the selective transistor QS2 is connected to the source line.

Figures 4, 5:
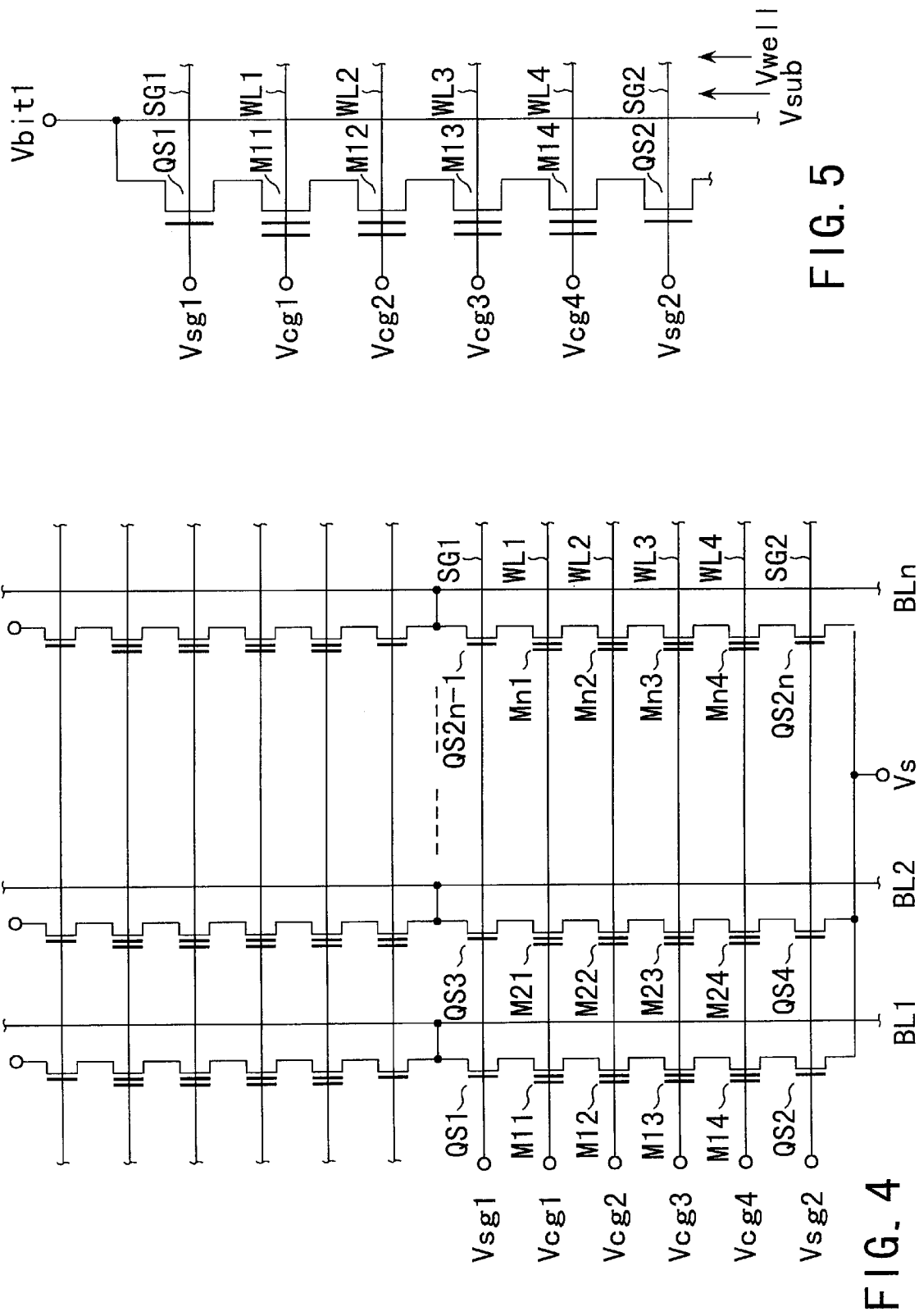
FIG. 4 is an equal circuit diagram of a NAND type EEPROM memory cell array.
FIG. 5 is a circuit diagram indicating voltages applied to each part of the NAND cell.

FIG. 4 is a circuit diagram of the NAND type EEPROM memory cell array having NAND cells each having the above-mentioned structure and arranged in array.

In general, a group of memory cells connected to the same word line is called as one page. A group of the pages sandwiched by a group of the selective transistor connected to the same selective gate line and located on the side of the drain and a group of the selective transistors connected in common to the other selective gate line and located on the side of the source is called as one NAND block (or merely one block). Generally, one block is the minimum unit which can be independently erased.

In the example shown in FIG. 4 The memory cells M11, M21, . . . , Mn1 connected to the word line WL1 constitute one page. The memory cells M11, M12, Mn3, and Mn4 sandwiched by the selective transistors QS1, QS3, . . . , QS2n−1 on the drain side and the selective transistors QS2, QS4, . . . , QS2n on the source side constitute one block. The drains of the selective transistors QS1, QS3, . . . , and QS2n−1 are respectively connected to the bit lines BL1, BL2, . . . , and BLn, and the sources of the selective transistors QS2, QS4, . . . , and QS2n are each supplied with a source potential Vs.

The following is the description of the operation of the NAND type EEPROM as shown in FIG. 4.

Figure 6:
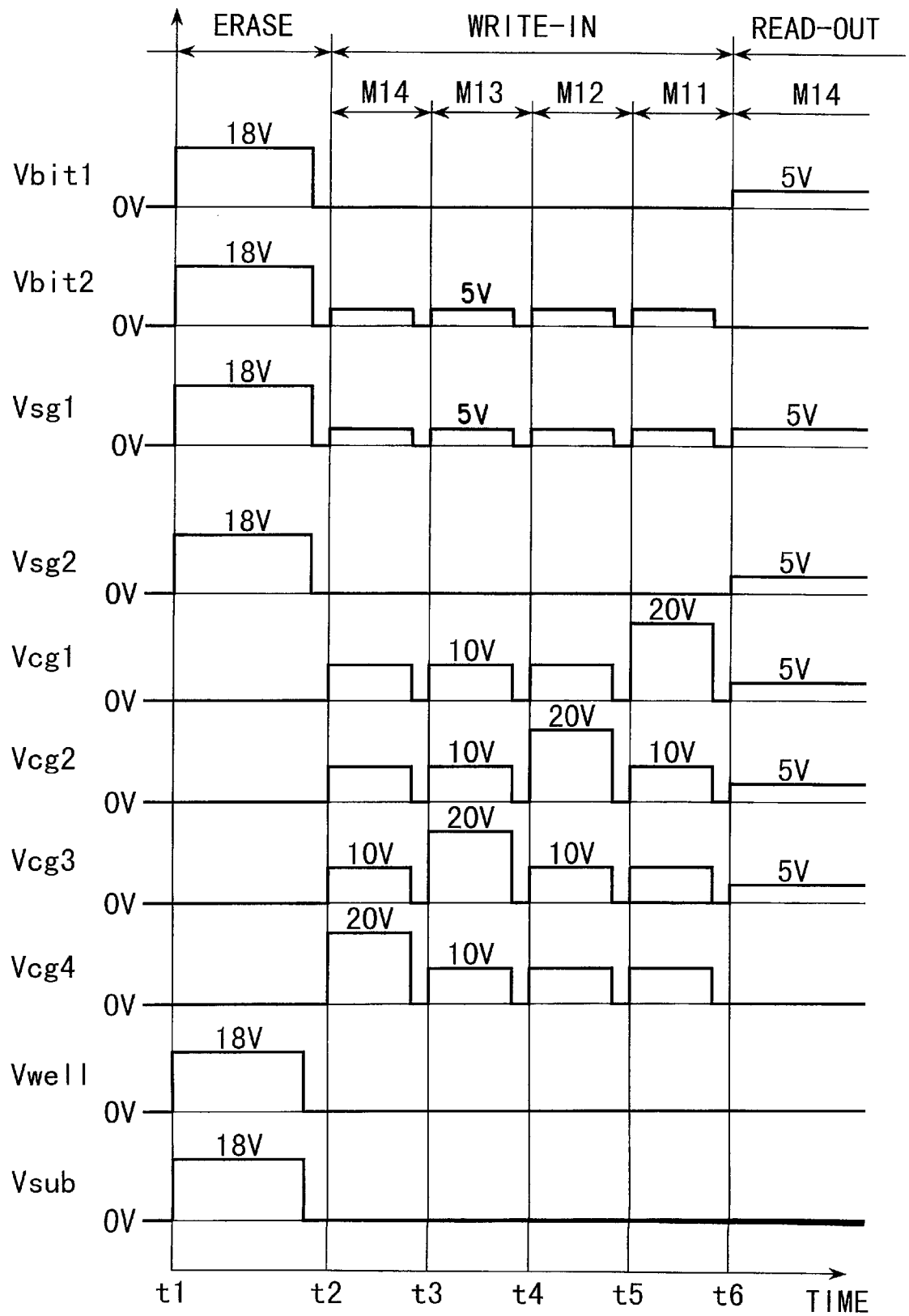
FIG. 6 is a timing chart showing a bias state in each of erase, write, and read operations when these operations are serially performed in the conventional NAND cell.

FIG. 5 is a diagram indicating the voltages applied to each part of the NAND cell or signals supplied to each part of the NAND cell. FIG. 6 is a timing chart showing the change of a bias state in each part of the NAND cell when erase, write, and read operations are serially performed in the NAND cell.

At first, the data erase operation will be described below.

The erase of data is performed in units of one NAND block. In erasing data, the data stored in the memory cells in a NAND block is simultaneously erased. Firstly, in the NAND block from which data is erased, potentials Vsg1 and Vsg2 of the selective gate lines SG1 and SG2 are set at a high potential (e.g. 18V) VPP. In the selected NAND block, the potentials Vcg1–Vcg4 of all the word lines are set at a ground potential Vss (e.g. 0V), and the potential Vwell of a p-type well and a potential Vsub of the n-type substrate are set at a high potential (e.g. 18V) VPP. The potentials Vbit1 and Vbit2, . . . , of the bit line BL1, BL2, . . . , are set at 18V, for example. By setting the potentials in this manner, electrons are emitted from floating gates to the substrate in all the memory cells, thereby the threshold voltages of the memory cells are shifted in a negative direction. Such a condition is defined as "1", in general. When the data stored in the entire chip is erased, all the NAND blocks are set as the selection state.

Next, the data write operation will be described below.

The data write operation is serially executed in units of page beginning in the memory cell the most distant from the bit line. More specifically, the selective gate line SG2 on the side of the source line SL is applied with a voltage of 0V to cut-off the transistor on the source side, then selected ones of the write bit lines BL1 to BLn (Vbit1 in FIG. 6) connected to the memory cell in which "0" data is to be written is applied with a voltage Vss (0V). On the other hand, the non-write bit lines BL1 to BLn (Vbit2 in FIG. 6) connected to the memory cells in which "1" data is to be written are applied with the equal voltage as that applied to the selective gate line SG1 on the drain side, or more, or the voltage (e.g. 5V) capable of reliably cutting off the selective transistor on the drain side even if the voltage is smaller than the voltage applied to the selective gate line on the drain side. By applying the voltage in this manner, the memory cells in which data is to be written and the non-selected (inhibited to be written) memory cells are discriminated in each of the bit lines BK1–BLn.

In such a condition, the word line corresponding to the page in the NAND block, in which data is to be written is applied with a high voltage VPP (e.g. 20V), and the other non-selected word lines are applied with a middle potential VM (e.g. 10V). When the bit line is applied with Vss (write "0"), the potential is transferred to the diffusion layer and the channel section of the memory cell connected to the selected word line, thereby electrons are injected into the floating gate of the memory cell. The threshold voltage of the memory cell is shifted in a positive direction thereby. This state is defined as a "0" condition. When the bit line is applied with 5V (write "1"), a selective transistor QS1 is cut-off (t2) after 5V or 5V–Vth (Vth is the threshold voltage of the selective transistor on the drain side) is transferred to the selected word line and the channel of the connected memory cell. The potential of the diffusion layer and channel of the NAND cell set to be floated increases by the capacity coupling with the word line applied with VPP or VM, thereby. Accordingly, no electron is thereby injected into the memory cell, and thus the threshold voltage of the memory cell is left at a negative state with no change. The above-mentioned write operation is selectively executed for the memory cells in order of M14, M13, M12, and M11.

Next, the data read operation will be described below. At first, the potential Vcg4 of the control gate of a selected memory cell in the NAND block (for example, memory cell M14 in FIG. 4) is set at Vss (0V), and the potentials of the other control gates and the gate potentials of the selective transistors are set to be equal to an external power supply voltage Vcc (e.g. 5V). In this time, it is detected whether or not a current flows through the selected memory cell to determine that data is written therein.

The data write operation in the conventional NAND type EEPROM, however, has a problem as described below.

Figure 7:
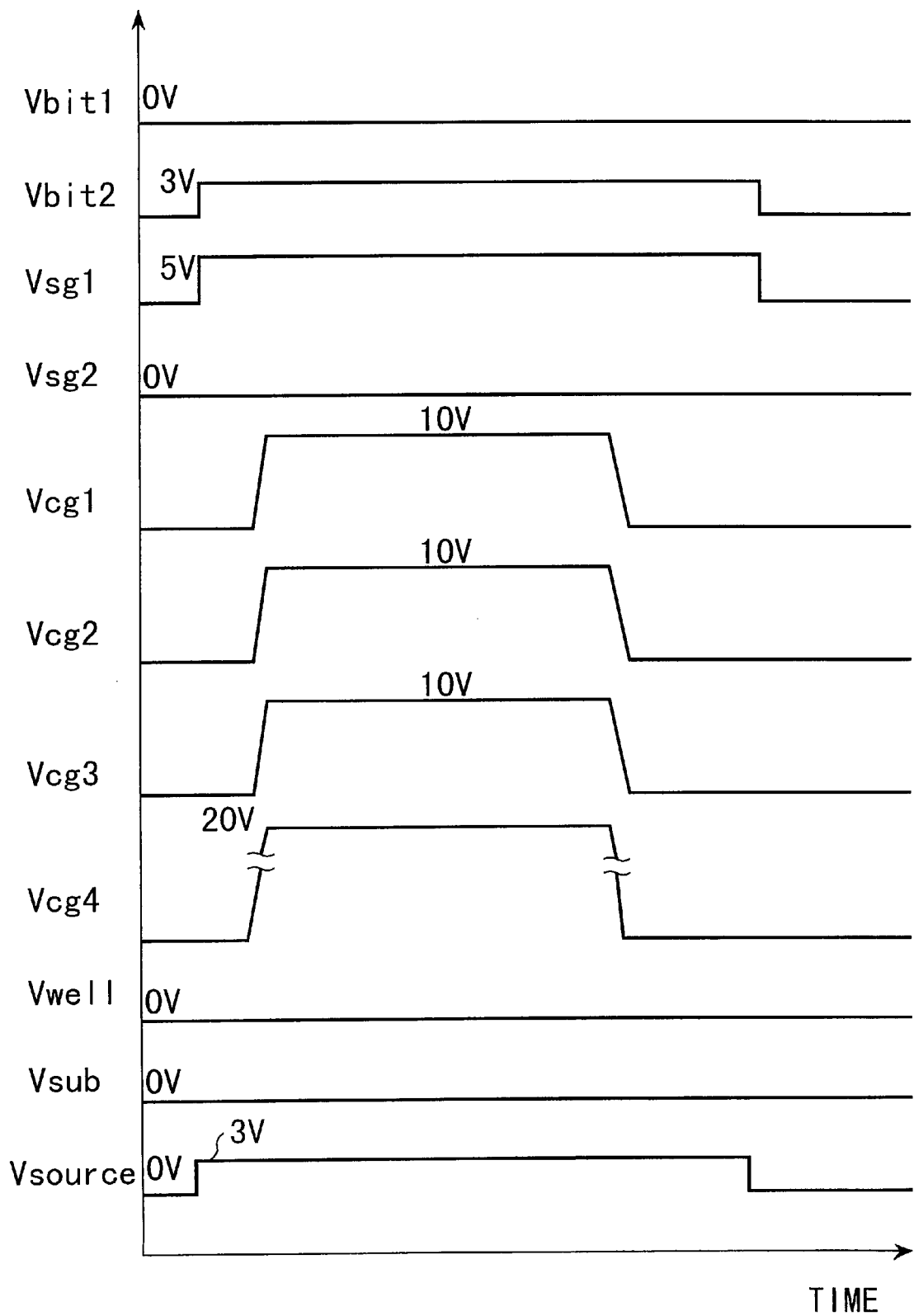
FIG. 7 is a timing chart of the write operation in the conventional NAND cell.

FIG. 7 is a timing chart of the write operation in a memory cell. With reference to this chart, the memory cell applied with 3V at the bit line will be described below. In order to boost Vcg1–Vcg4 to 10V or 20V, the potentials of the diffusion layers and the channel sections of the memory cells M1–M4 are increased to approximately 8V, according to the above-mentioned write method. In this time, the selective transistor QS1 is cut-off by the backgating effect. However, when the voltage applied to the bit line decreases, the selective transistor QS1 cannot be easily cut-off.

Further, if an element isolation film is formed by the STI (Shallow Trench Isolation), the impurity concentration of the channel region is lower than that of the device having the element isolation film formed by the LOCOS, and the backgating effect of the selective transistor QS1 is eliminated. As a result, the cut-off of the selective transistor QS1 is made to be more difficult. Accordingly, the potentials of the diffusion layers of the memory cells M1–M4 are transferred to the bit line, thereby the potential increased to about 8V will decreases. In such a condition, the writing error will be easily occur.

In addition, as the external power supply voltage Vcc is decreased, the voltage applied to the bit line and the voltage applied to the gate of the selective transistor have been decreased. Accordingly, the voltage applied to the diffusion layer of the memory cell in data write operation is decreased, thereby the writing error will be easily occur.

Next, the embodiments of the present invention will be described below, by which the above-mentioned problems can be solved.

First Embodiment

Figure 8:
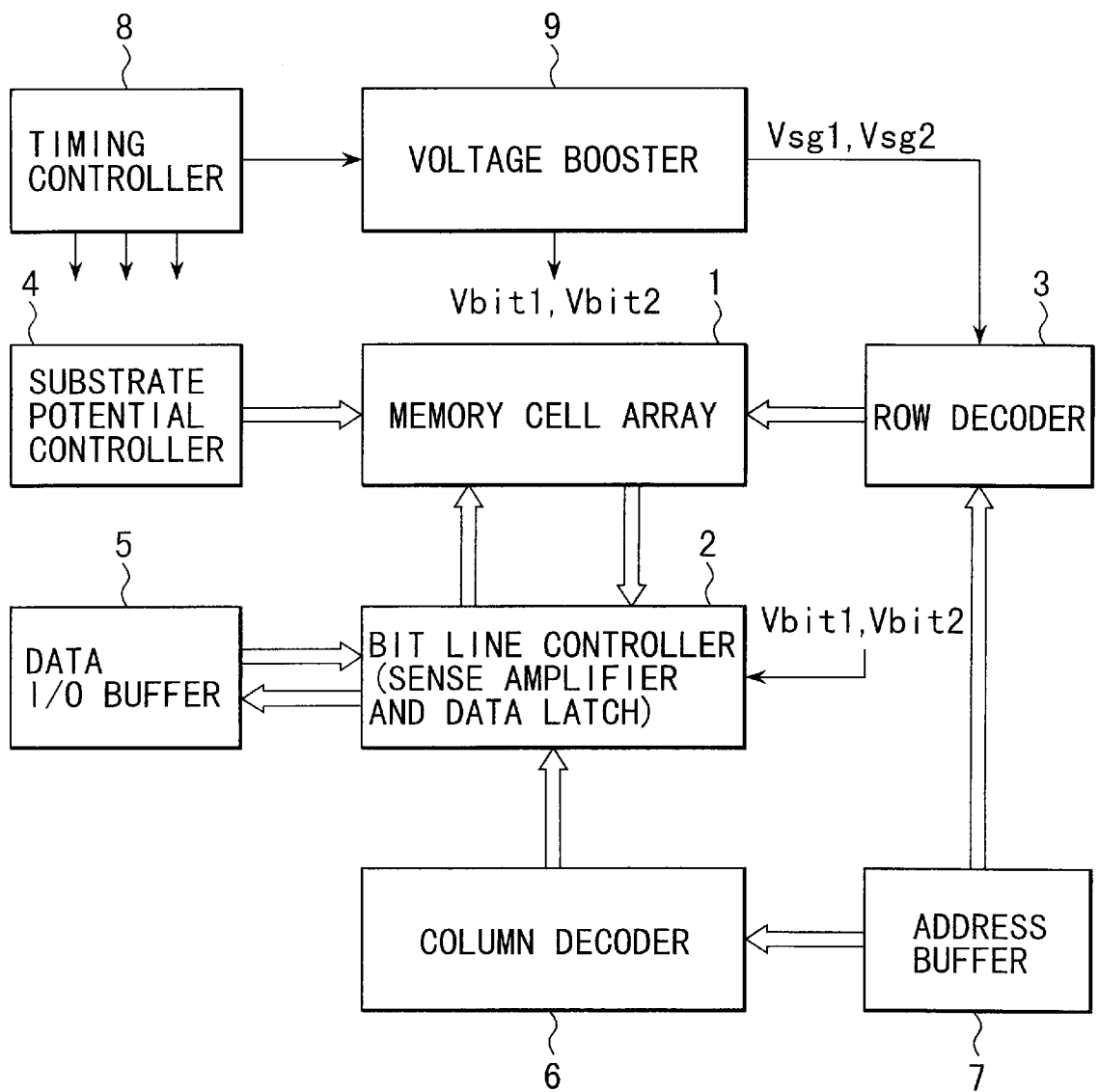
FIG. 8 is a block diagram showing a constitution of a non-volatile semiconductor memory device according to a first embodiment of the present invention.

FIG. 8 is a block diagram showing a constitution of a non-volatile semiconductor memory device according to a first embodiment of the present invention. A memory cell array 1 includes a plurality of NAND cells arranged in row and column directions in matrix (not shown), and word lines, bit lines, selective gate line, and a source line, which are connected to the NAND cells. The memory cell array 1 is connected to a bit line controller 2, a row decoder 3 as row selection means, and a substrate potential controller 4 for controlling a potential Vwell of a p-type region (p-substrate or p-type well) on which the memory cell array 1 is formed. The bit line controller 2 has a sense amplifier/data latch circuit constituted mainly of a CMOS flip-flop circuit. The flip-flop circuit performs the latch of the data to be written in a memory cell, sensing operation for detecting the potential of a bit line, sensing operation for reading to verify the written data, and the latch of data to be rewritten. The bit line controller 2 is connected to a data I/O buffer 5 for holding input/output data and a column decoder 6 as column selecting means.

An address buffer 7 is connected to the row decoder 3 and the column decoder 6. The address buffer 7 supplies the address signal to the row decoder 3 and the column decoder 6. The row decoder 3 and the column decoder 6 select predetermined word line and bit line of the memory cell array 1 in accordance with the supplied address signal.

A timing controller 8 generates a signal for controlling write operation, reading operation, verifying operation, or the like. A voltage booster (voltage booster) 9 is connected to the row decoder 3 and the bit line controller 2. The voltage booster 9 generates a write voltage (20V, for example) from a power supply voltage Vcc, potentials Vbit1 and Vbit2 (applied in non-data writing) of the bit lines, potentials Vsg1 and Vsg2 of the selective gate lines, or the like, in accordance with the signal supplied from the timing controller 8. The potentials Vbit1 and Vbit2 of the bit lines are supplied to the bit line controller 2, and the potentials Vsg1 and Vsg2 of the selective gate lines are supplied to the row decoder 3.

Figure 9:
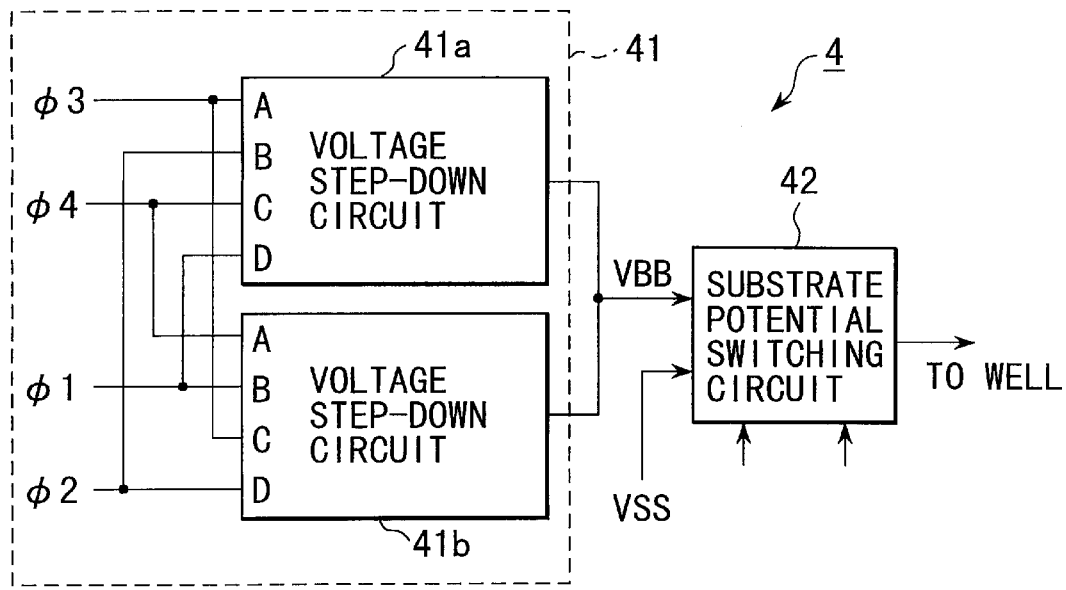
FIG. 9 is a block diagram showing a substrate of a substrate potential controller shown in FIG. 8.

FIG. 9 shows the substrate potential controller 4 described above. The substrate potential controller 4 is constituted of a negative potential generator 41 and a substrate potential switching circuit 42, for example. The negative potential generator 41 is constituted of two voltage step-down circuits (voltage step-down circuits) 41a and 41b, for example. The voltage step-down circuits 41a and 41b have the same constitution and generate a negative potential VBB lower then the power supply voltage in response to clock signals φ1–φ4. The two voltage step-down circuits are provided to attain a large amount of electric current. The negative potential generator 41 can be therefore constituted of one voltage step-down circuit if the voltage step-down circuit attains a predetermined amount of electric current.

The substrate potential switching circuit 42 selects either the output potential of the negative potential generator 41 or a ground potential VSS in accordance with write operation or read operation to a memory cell, to supply the selected potential to the p-type region (P well) on which the memory cell array is formed.

Figure 10:
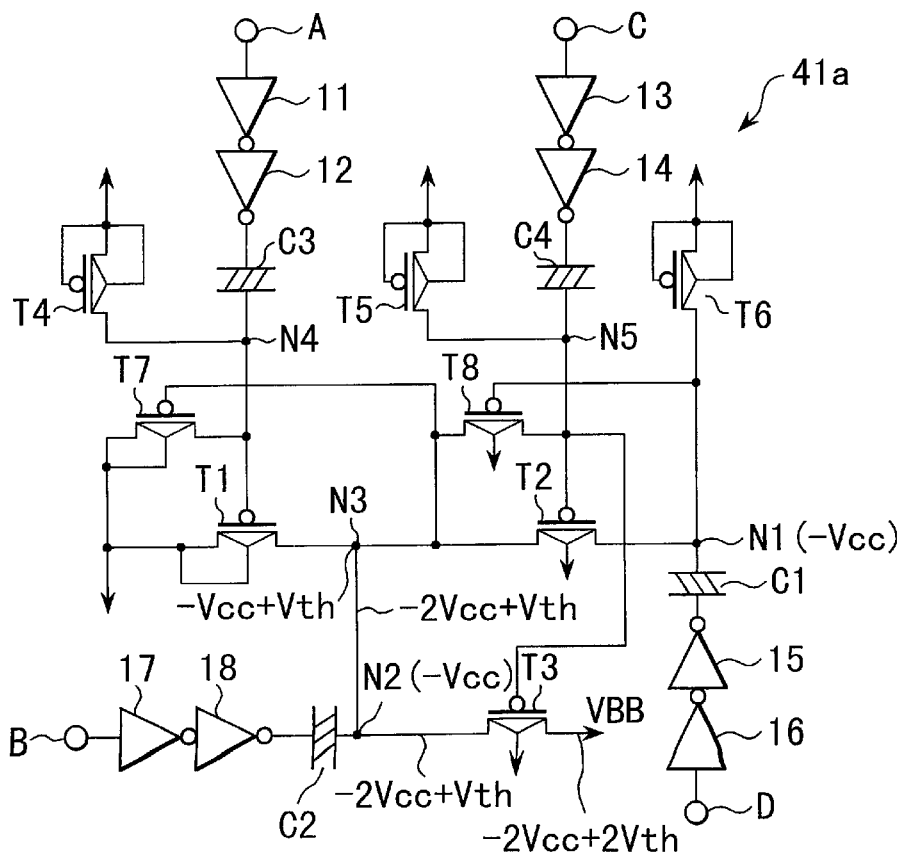
FIG. 10 is a circuit diagram of a voltage step-down circuit shown in FIG. 9.

FIG. 10 shows one example of the voltage step-down circuit 41a. The voltage step-down circuit 41a is a pump circuit which operates in response to the clock signal φ1–φ4 supplied to input terminals A–D. The voltage step-down circuit 41a is constituted of a plurality of capacitors C1–C4, a plurality of p-channel transistors T1–T8, and a plurality of inverter circuits I1–I8.

The clock signals φ1 and φ2 are complimentary signals, the clock signal φ3 is a signal set at a high level during a period in which the clock signal φ1 is set at high, and the clock signal φ4 is a signal which is set at a high level during a period in which the clock signal φ2 is set at high. The period during which the clock signals φ3 and φ4 are set at high is set shorter than the period during which the clock signals φ1 and φ2 are set at high.

The capacitor C1 of the above-mentioned voltage step-down circuit 41a sets a node N1 at a potential −Vcc in response to the clock signal φ1 supplied to the input terminal D. The capacitor C3 then sets a node N4 at a potential −Vcc in response to the clock signal φ3 supplied to the input terminal A. By setting the potentials in this manner, the transistor T1 is turned on to discharge the potential of the node N3.

Thereafter, the capacitor C2 sets the node N2 at a potential −Vcc in response to the clock signal φ2 supplied to the input terminal B. The capacitor C4 then sets a node N5 at a potential −Vcc in response to the clock signal φ4. The transistors T2 and T3 are thereby turned on to transfer the potential of the node N1 to the node N3 via the transistor T2. The potential of the node N3 is set at −Vcc+Vth lower than that of the node N1 by the threshold voltage Vth of the transistor T2. The nodes N3 and N2 are connected to each other, and thus the potentials of the nodes N2 and N3 are set as $$-Vcc+Vth+(-Vcc)=-2Vcc+Vth.$$

This potential is output to the output terminal via the transistor T3 turned on simultaneously with the transistor T2. Accordingly, a negative potential VBB output from the output terminal is set at a potential −2Vcc+2Vth which is lower than the sum of the potentials of N2 and N3 by the threshold voltage Vth of the transistor T2. The capacitors C3 and C4 have a function of enhancing the potential transferring ability of the transistors T1 and T2. The transistors T4–T6 are diodes.

Figure 11:
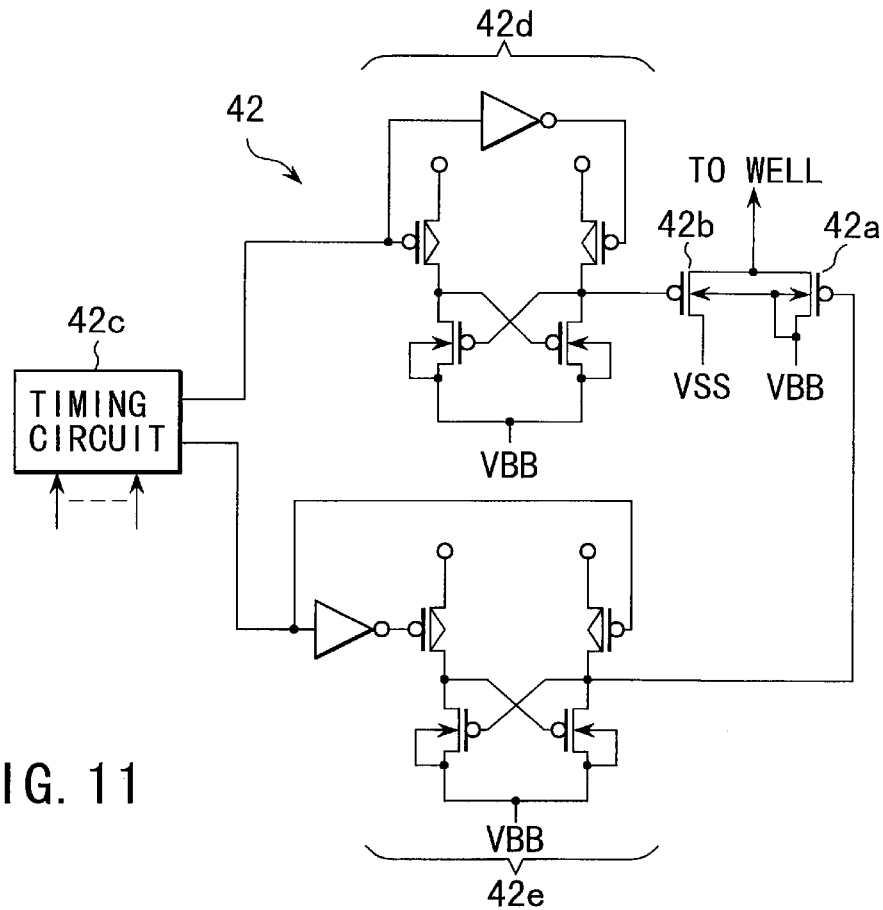
FIG. 11 is a circuit diagram of a substrate potential switching circuit shown in FIG. 9.

FIG. 11 shows one example of the substrate potential switching circuit 42. In the substrate potential switching circuit 42, one end of an electric current path of a N-channel transistor 42a is applied with a negative potential VBB output from the potential generator 41, and one end of en electric current of a N-channel transistor 42b is applied with the ground potential VSS. The other ends of the electric current paths of the transistors 42a and 42b are both connected to a well (not shown). A timing circuit 42c generates a timing signal in response to a signal instructing write or read operation of the memory cell, and outputs it. The timing signal is supplied to the input terminals of the gate controllers 42d and 42e. The output terminals of the gate controllers 42d and 42e are connected to the gates of the transistors 42b and 42a, respectively. The transistors 42a and 42b are selectively turned on in accordance with the output signals of the gate controllers 42d and 42e, and the ground potential VSS or the negative potential VBB is applied to the well via the transistors 42a and 42b.

Figure 12:
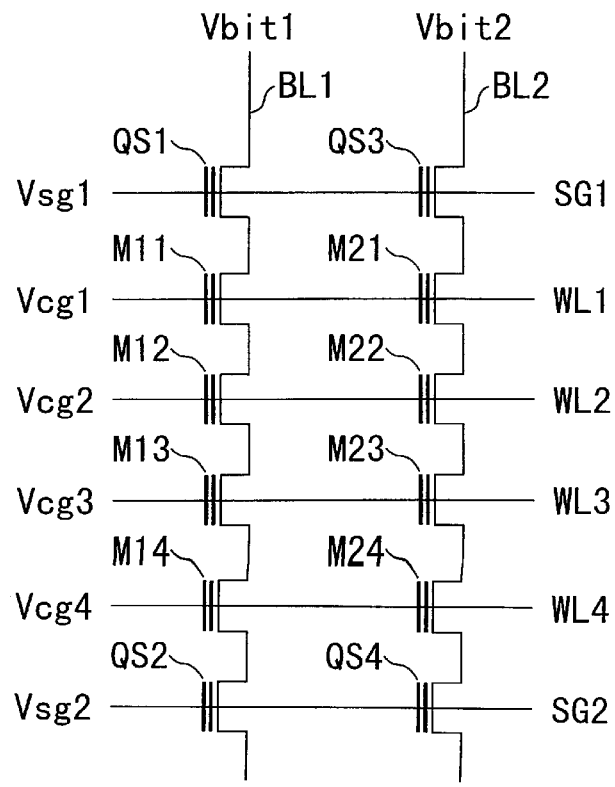
FIG. 12 is a circuit diagram of a part of the memory cell array shown in FIG. 8.

The NAND cell in the memory cell array 1 shown in FIG. 8 has a constitution shown in FIGS. 1, 2, and 3. FIG. 12 is an equal circuit diagram of the main part of the memory cell array 1 shown in FIG. 8. The NAND cell type EEPROM is constituted of four memory cells and two selective transistors in this embodiment, but the number of the elements is not limited thereto.

Figure 13:
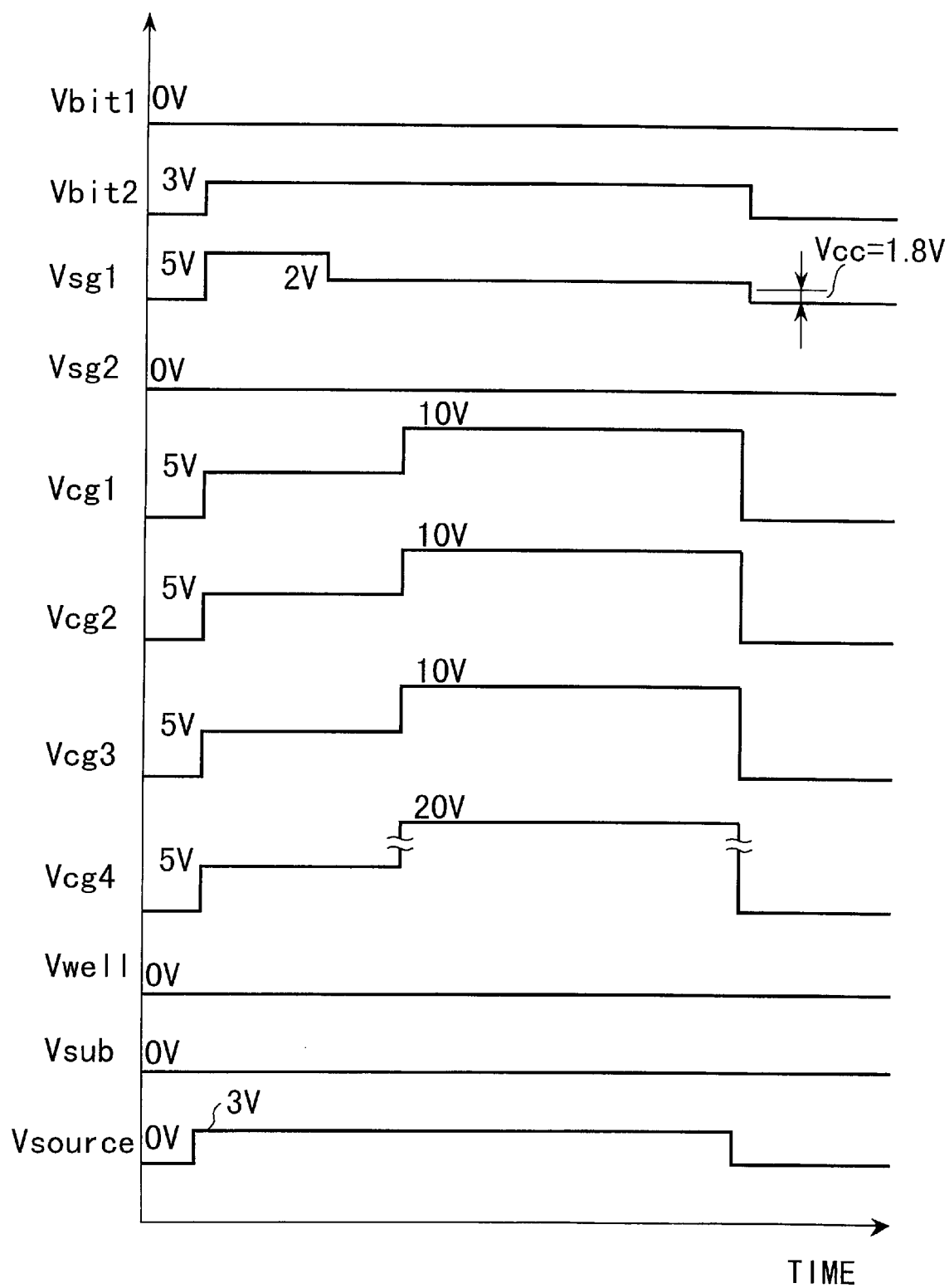
FIG. 13 is a timing chart of a write operation according to the first embodiment of the present invention.

FIG. 13 is a timing chart of a write operation (program operation) in the NAND cell type EEPROM shown in FIG. 12, for example, a timing chart of an operation when the data is written in the memory cell M14. In the NAND cell type EEPROM, the data write and erase operations are performed by supplying/receiving electric charges with use of a tunnel current which will flow between the substrate (the p-type well) and the floating gate.

In the first embodiment, the external power supply voltage Vcc is set at 1.8V, for example. The voltages higher than the external power supply voltage (e.g. the voltage of the non-write bit line, the potential of the selective gate line, and the like) are all generated by the voltage booster 9. In this embodiment, the voltage of the non-write bit line is set at 3V, and the potential of the selective gate line is set at 5V/2V, so as to be higher than the power supply voltage (1.8V) in order to prevent the writing error with reliability.

More specifically, the voltage Vbit1 of the write bit line BL1 is set at 0V, and the voltage Vbit2 of the non-write bit line BL2 is set at 3V, for example, as shown in FIG. 13. The potential Vsg1 of the selective gate line SG1 is applied with 5V, for example, as the first voltage, and a voltage Vdif is transferred to the diffusion layers of the memory cells. In this time, the potentials Vcg1–Vcg4 of the control gates of the memory cells are set at 5V, for example, and the potentials of the diffusion layers and the channel sections of all the memory cells are set at Vdif. When the relationship Vbit2>Vsg1−Vth(−Vdif) is attained, the voltage Vdif can be represented as shown in a formula (1):

$$Vdif = Vsg1 - Vth(-Vdif) \qquad (1)$$

(where Vth(−Vdif) is the threshold voltage of the selective transistor when Vdif is applied as a back bias voltage).

On the other hand, when a relationship Vbit2<Vsg1−Vth (−Vdif) is attained, the voltage Vdif can be represented as shown in a formula (2):

$$Vdif = Vbit2 \qquad (2)$$

The voltage Vsg1 is then decreased to a second voltage of 2V, for example. The voltage can be decreased to the lower limit by which the voltage Vbit1 of the bit line (0V) can be transferred to the memory cell side.

Then, the voltages Vcg1–Vcg3 of the word lines WL1–WL3 are set at 10V, and the voltage Vcg4 of a word line WL4 is increased to 20V, for example. In this time, Vdif is coupled with the voltages Vcg1–Vcg4 and increased to 8V, for example, to prevent the writing error in the memory cell. In this embodiment, the voltage Vsg1 of the selective gate line SG1 is decreased to 2V before the voltages Vcg1–Vcg4 of the word lines WL1–WL4 are increased. Accordingly, the selective transistor can be cut-off with reliability, and the charge (Vdif) of the diffusion layers and the channels of the memory cells is discharged to the bit line via the selective transistor, the potentials of the diffusion layers and the channels can be thereby prevented from dropping. Accordingly, the writing error in the memory cell can be surely prevented.

According to the conventional write method shown in FIG. 7, when the voltages Vcg1–Vcg4 of the word lines WL1–WL4 are increased to 10V or 20V, the voltage Vsg1 of the selective gate line SG1 remains at 5V. Accordingly, the selective transistor is turned on, and the voltage Vdif is discharged to the bit line BL2, and the writing error may occur in the memory cell connected to the non-write bit line.

In contrast, according to the first embodiment, the voltage Vsg1 is decreased to 2V, and thus the relationship represented by a formula (3) as shown below will be attained:

$$Vsg1 - Vbit2 < Vth(-Vbit2) \quad (3)$$

When the relationship represented by the formula (3) is satisfied, the selective transistor QS3 is turned off. In this condition, no writing error will occur, and thus the normal operation can be attained. The scope of the value of Vsg1 can be represented by a formula (4) attained by modifying the formula (3):

$$Vsg1 < Vbit2 + Vth(-Vbit2) \quad (4)$$

On the other hand, the scope of the value of Vsg1 is determined by the condition where the selective transistor QS1 connected to Vbit1 is turned on. More specifically, the scope of the value of Vsg1 can be represented by a formula (5).

$$Vth(0) < Vsg1 < Vbit2 + Vth(-Vbit2) \quad (5)$$

where Vsg1 and Vbit2 are both higher than the external power supply voltage, as mentioned above. Accordingly, the selective transistor connected to the non-write bit line can be cut off with reliability, and thus the writing error can be prevented. More specifically, in the case where the voltages of parts of the selective transistor connected to the non-write bit line shown in FIG. 12 are set as Vbit2, Vsg1, and Vdif (voltage of the diffusion layer on the side opposite to the bit line), the voltages Vbit2, Vsg1, and Vdif are set higher than the potential Vwell of the well when a boosted voltage is applied to the gate and the bit line of the selective transistor. Thereby, the same effect as the decreasing of the voltage Vwell can be attained, and thus the selective transistor cut-off ability can be enhanced by the backgating effect, with a result that the writing error can be prevented.

In FIG. 13, $V_{SOURCE}$ denotes the potential of the source line. The voltage $V_{SOURCE}$ is applied with a potential of 3V for a period during which Vbit2 is applied with 5V or 2V in order to cut off the selected transistor QS2 on the source side with reliability. The voltage $V_{SOURCE}$ is set in the similar manner in the embodiments following hereto.

In the above-mentioned embodiment, the bit line 1 is set as a write bit line, and the bit line 2 is set as the non-write bit line, but the write bit lines other than the bit line 1 may be provided to the device. In such a case, data can be written in a plurality of write bit lines simultaneously. The same may be said in the following embodiments.

Second Embodiment

The second embodiment of the present invention will be described below with reference to FIG. 14.

Figure 14:
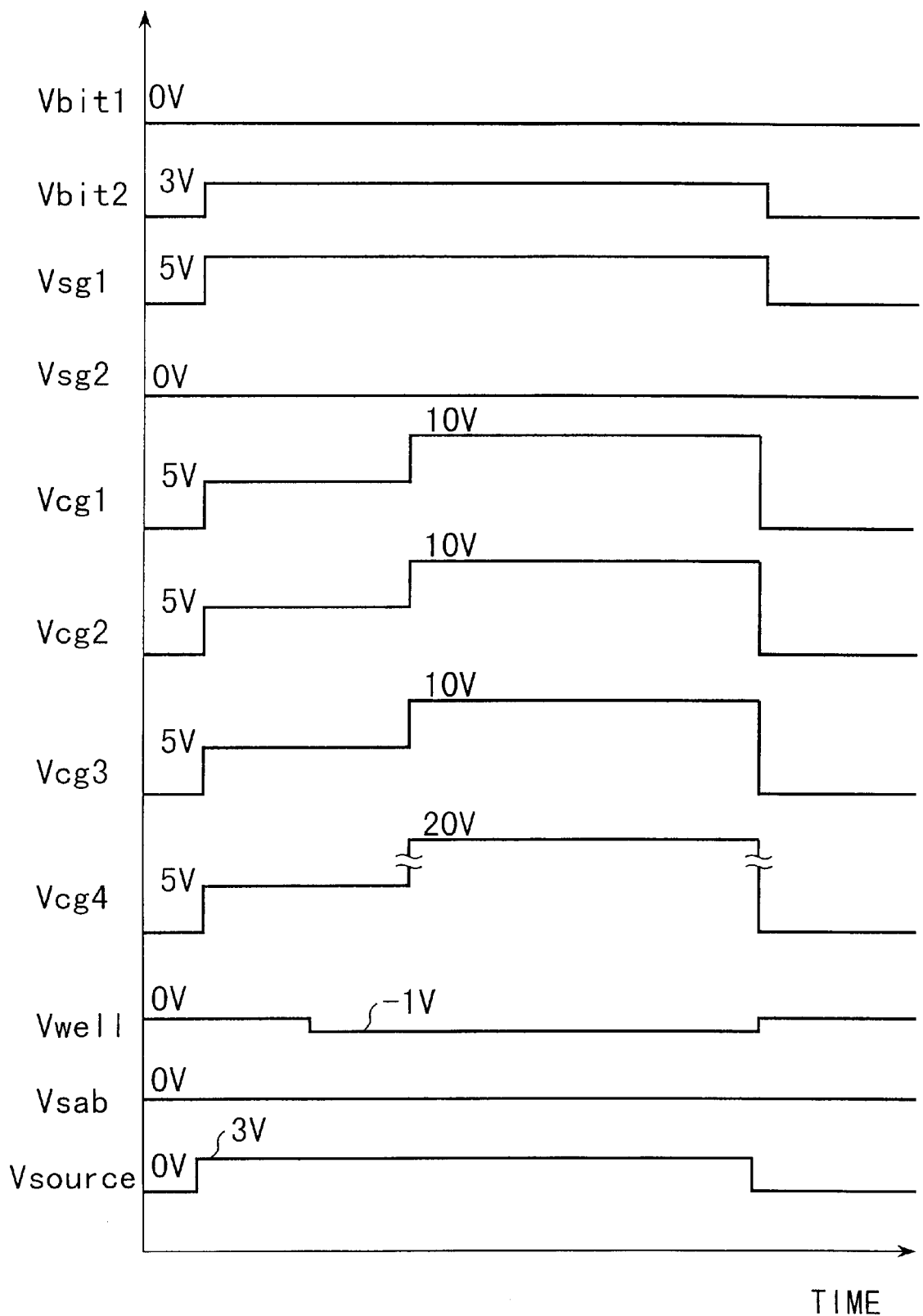
FIG. 14 is a timing chart of a write operation according to a second embodiment of the present invention.

In the second embodiment, the voltage Vsg1 of the selective gate line SG1 is fixed, as shown in FIG. 14. Instead of setting the voltage Vsg1 variable, the potential Vwell applied to the well 12 is set variable within a scope from 0V to negative potential, −1V, for example, before applying the word lines WL1–WL4 with a middle voltage or a write voltage. By setting the potentials in this manner, the threshold voltage Vth of the selective transistor will increase, and thus the selective transistor QS3 can be cut off even if the voltages Vcg1–Vcg4 of the word lines WL1–WL4 are increased to 10V or 20V. More specifically, by setting the potentials in this manner, the value Vbit2+Vth(−Vbit2) represented by the formula (5) in the first embodiment to define the scope of the voltage Vsg1 of the selective gate line SG1 is increased to $$Vbit2 + Vth(-Vbit2 + Vwell),$$

thereby the same effect as that attained from the first embodiment can be attained from this embodiment by enlarging the scope of the voltage Vsg1. The writing error thus can be also prevented according to the present embodiment. This method by applying Vwell is more effective if the voltage Vsg is set at high to prevent the writing error. More specifically, when the voltage Vsg is set at high and the voltage Vbit is set a constant value, the threshold voltage Vth(−Vbit+Vwell) can be arbitrarily set at a high level by applying a negative voltage Vwell, as represented in the following formula (6):

$$Vth(0) < Vsg < Vbit + Vth(-Vbit + Vwell) \quad (6)$$

The period of time for which the well is applied with the negative voltage can be arbitrarily determined if it is performed during the period from the time of applying the word lines WL1–WL4 with 5V to the time of applying a middle voltage (10V) or a write voltage (20V) to the word lines. The best is the time of applying a middle voltage (10V) or a write voltage (20V). In the case where the word lines WL1–WL4 are applied with 5V at the time when the negative voltage is applied to the well, the formula (6) is modified to a formula (7) as shown below:

$$Vth(Vwell) < Vsg < Vbit + Vth(-Vbit + Vwell) \quad (7)$$

Third Embodiment

Figure 15:
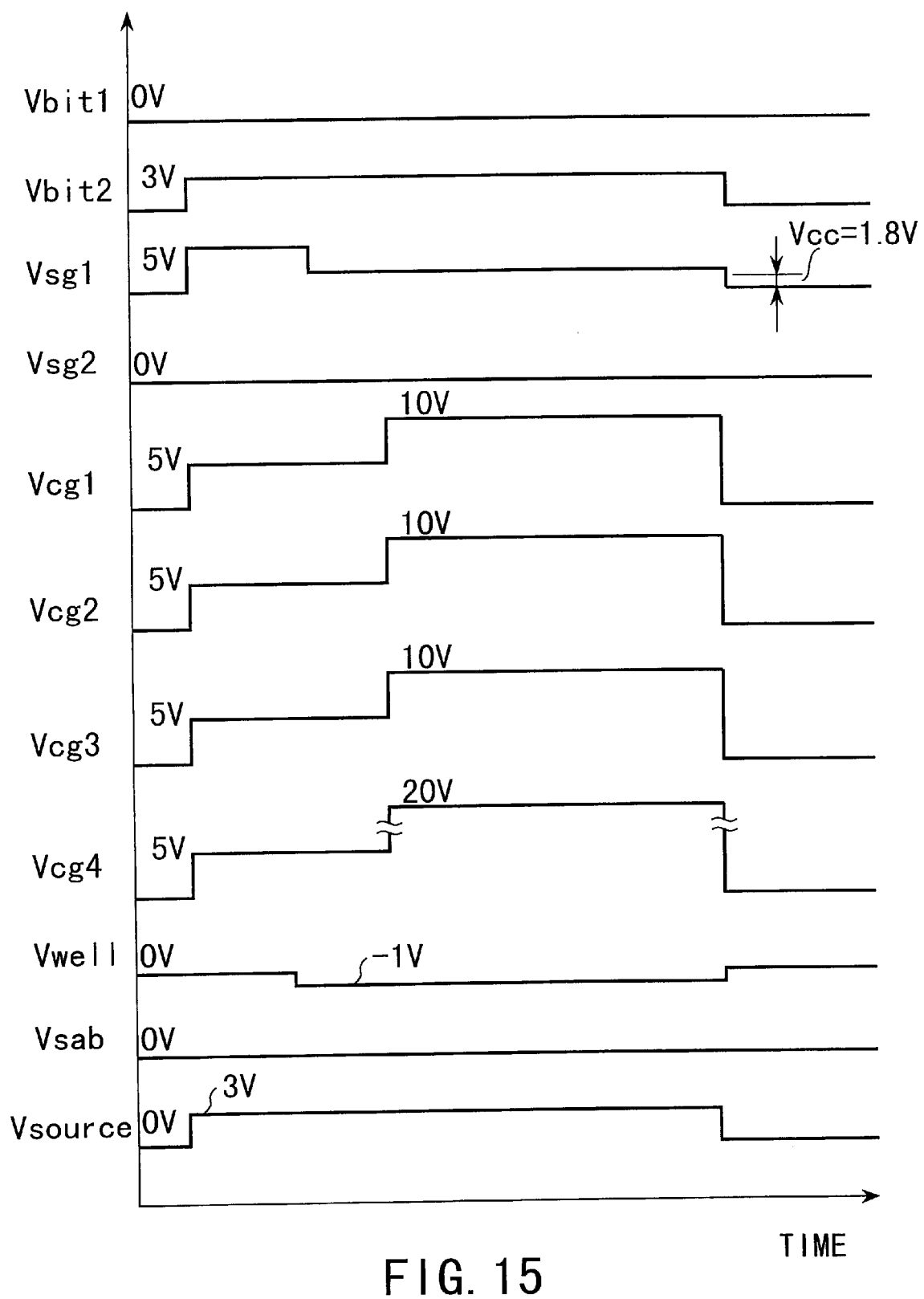
FIG. 15 is a timing chart of a write operation according to a third embodiment of the present invention.

Next, the third embodiment of the present invention will be described below with reference to FIG. 15.

The third embodiment is intended to simultaneously perform the two methods described in the first and second embodiments. According to the method of the third embodiment, the voltage Vsg1 of the selective gate line SG1 is set in write operation as 5V, for example, then decreased from 5V to 2V, as shown in FIG. 15. Simultaneously, the potential Vwell of the well is decreased from 0V to −1V, for example. By controlling the voltage Vsg1 of the selective gate line and the potential Vwell of the well in this manner, the cut-off of the selective transistor can be surely performed, thereby the writing error can be prevented with reliability.

Figure 16:
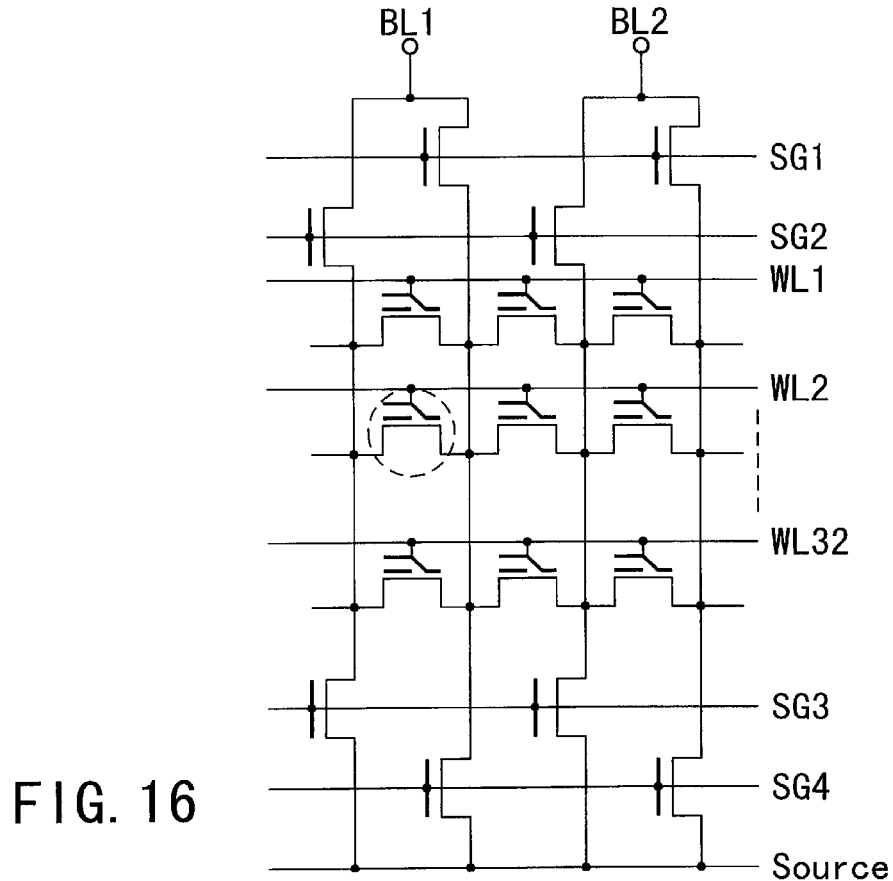
FIG. 16 is a circuit diagram of a ground cell array to which the present invention can be applied.
Figure 17:
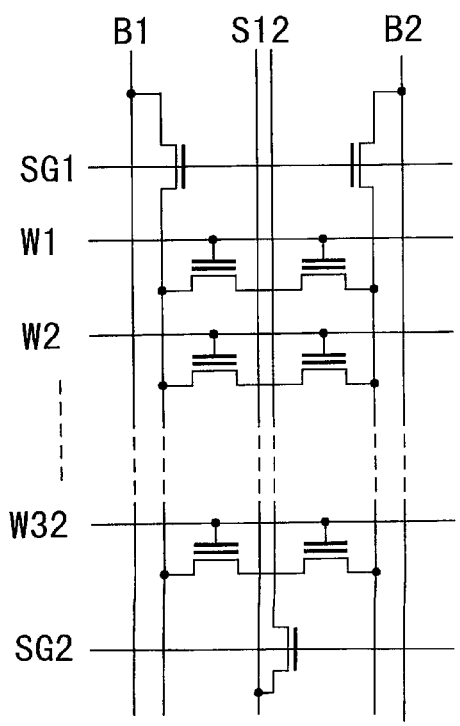
FIG. 17 is a circuit diagram of a HiCR type cell array to which the present invention can be applied.
Figure 18:
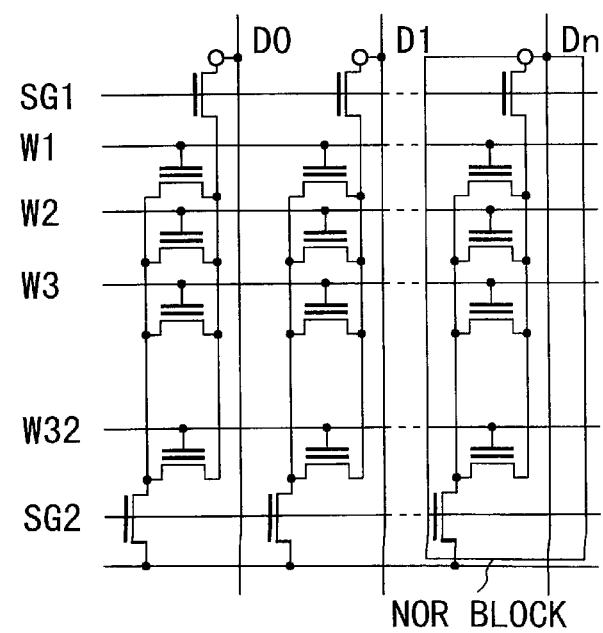
FIG. 18 is a circuit diagram of an AND type cell array to which the present invention can be applied.

The present invention is not limited to the above-mentioned embodiments. In the above-mentioned embodiments, a NAND type EEPROM has been described, but the present invention can be applied to various types of EEPROMs having the selective gate. The present invention can be applied not only to the EEPROM having the chargestorage layer formed as a floating gate type, but also to the NAND type EEPROM having a MNOS type memory cells. Further, the NAND cell constituted of MOS transistors as memory cells into which information is fixedly written by the ion implantation into the channel or the like, i.e., memory cells so-called as mask ROMs, can be applied with the present invention. The present invention can be applied to such a memory cell as a ground array type cell having bit lines constituted of diffusion layers (see FIG. 16); a HiCR type cell (see FIG. 17); an AND type memory cell (see FIG. 18); and a DINOR type memory cell having sub-bit line. Also in the cases where the present invention is applied to the above-mentioned types of memory cell, the selective transistor can be reliably cut-off by controlling the voltages of the selective gate line, of the bit lines, and of the substrate in data write operation at suitable values. In this manner, the present invention provide the non-volatile semiconductor memory device capable of preventing the writing error from occurring even if the voltages applied to the bit line and the selective gate line are dropped, or the element isolation is formed by the STI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A non-volatile semiconductor memory device comprising:
    a semiconductor substrate;
    a memory cell array formed on the semiconductor substrate, the memory cell array comprising a plurality of memory cell units arranged in rows and columns, each of the memory cell units being constituted of a plurality of electrically rewritable memory cells connected to each other, each of the memory cell units having a first selective transistor at one end;
    a plurality of data lines arranged in parallel substantially in a column direction, each of the data lines being connected to corresponding memory cell units at the one end of each of the memory cell units; and
    a selective gate line connected to a gate of the first selective transistor,
    the non-volatile semiconductor memory device executing an operation wherein,
    during data writing operation of writing data in selected one of the memory cells constituting selected one of the memory cell units connected to selected one of the data lines, a voltage Vsg of the selective gate line is set at a certain voltage which is higher than an external power supply voltage and satisfies a relationship $$Vth(0) < Vsg < Vbit + Vth(-Vbit)$$

where Vth(x) is a threshold voltage of the first selective transistor in applying x volt to a semiconductor substrate surface on which the memory cell array is formed, and Vbit is a voltage applied to a non-select data line among the plurality of data lines,
    and the voltage Vbit is set at a voltage higher than the external power supply voltage.

2. The non-volatile semiconductor memory device according to claim 1, wherein each of the memory cell units has a second selective transistor at the other end thereof.

3. The non-volatile semiconductor memory device according to claim 1, wherein the memory cells constituting each of the memory cell units are connected in series to constitute a NAND type memory cell.

4. The non-volatile semiconductor memory device according to claim 1, wherein the semiconductor memory device further executes an operation during the data writing operation, in which voltages of the data lines are transferred to the memory cell units each via the first selective transistor before the voltage Vsg of the selective gate line is set at the certain voltage, by setting the voltage Vsg of the selective gate line at a high voltage higher than the certain voltage.

5. The non-volatile semiconductor memory device according to claim 4, wherein each of the memory cells has a control gate, the control gate being applied with the high voltage during a beginning of the data writing operation.

6. The non-volatile semiconductor memory device according to claim 1, wherein the voltage Vsg is high enough to transfer a voltage of the selected one of the data lines to the selected one of the memory cell units.

7. A non-volatile semiconductor memory device comprising:
    a semiconductor substrate;
    a memory cell array formed on the semiconductor substrate, the memory cell array comprising a plurality of memory cell units arranged in rows and columns, each of the memory cell units being constituted of a plurality of electrically rewritable memory cells connected to each other, each of the memory cell units having a first selective transistor at one end;
    a plurality of data lines arranged in parallel substantially in a column direction, each of the data lines being connected to corresponding memory cell units at the one end of each of the memory cell units; and
    a selective gate line connected to a gate of the first selective transistor,
    the non-volatile semiconductor memory device executing an operation wherein,
    during data writing operation of writing data in selected one of the memory cells constituting selected one of the memory cell units connected to selected one of the data lines, a voltage Vsg of the selective gate line is set at a certain voltage which satisfies a relationship $$Vth(Vwell) < Vsg < Vbit + Vth(-Vbit + Vwell)$$

where Vth(x) is a threshold voltage of the first selective transistor in applying x volt to a semiconductor substrate surface on which the memory cell array is formed, and Vbit is a voltage applied to non-select data line among the plurality of data lines, and Vwell is a voltage of the semiconductor substrate surface on which the memory cell array is formed and satisfies Vwell<0.

8. The non-volatile semiconductor memory device according to claim 7, wherein each of the memory cell units has a second selective transistor at the other end thereof.

9. The non-volatile semiconductor memory device according to claim 7, wherein the memory cells constituting each of the memory cell units are connected in series to constitute a NAND type memory cell.

10. The non-volatile semiconductor memory device according to claim 7, wherein the semiconductor memory device further executes an operation during the data writing operation, in which voltages of the data lines are transferred to the memory cell units each via the first selective transistor before the voltage Vsg of the selective gate line is set at the certain voltage, by setting the voltage Vsg of the selective gate line at a high voltage higher than the certain voltage.

11. The non-volatile semiconductor memory device according to claim 10, wherein each of the memory cells has a control gate, the control gate being applied with the high voltage during a beginning of the data writing operation.

12. The non-volatile semiconductor memory device according to claim 7, wherein the voltage Vsg is high enough to transfer a voltage of the selected one of the data lines to the selected one of the memory cell units.

13. A non-volatile semiconductor memory device comprising:

a semiconductor substrate;

a memory cell array formed on the semiconductor substrate, the memory cell array comprising a plurality of memory cell units arranged in rows and columns, each of the memory cell units being constituted of a plurality of electrically rewritable memory cells connected to each other, the memory cell units having selective transistors at one ends, respectively;

a plurality of bit lines arranged in parallel substantially in a column direction, each of the bit lines being connected to corresponding memory cell units at the one ends of the memory cell units; and a selective gate line connected to gates of the selective transistors, the non-volatile semiconductor memory device executing an operation wherein, during data writing operation of writing data in at least selected one of the memory cells constituting at least selected one of the memory cell units connected to at least selected one of the bit lines, a voltage Vsg of the selective gate line is set at a first voltage higher than a power supply voltage to transfer voltages of the bit lines to the memory cell units through the selective transistors, and the voltage Vsg of the selective gate line is set at a second voltage higher than the power supply voltage to cut off at least a part of the selective transistors thereafter.

14. The non-volatile semiconductor memory device according to claim 13, wherein a voltage of the semiconductor substrate surface on which the memory cell array is formed is set at a voltage lower than a ground potential when the voltage Vsg of the selective gate line is set at the second voltage.

15. The non-volatile semiconductor memory device according to claim 13, wherein a voltage of a non-write bit line among the bit lines is set higher than the power supply voltage.

16. The non-volatile semiconductor memory device according to claim 13, wherein the second voltage is high enough to transfer a voltage of the selected one of bit lines to the selected one of the memory cell units.

17. A non-volatile semiconductor memory device comprising:

a semiconductor substrate;

a memory cell array formed on the semiconductor substrate, the memory cell array comprising a plurality of memory cell units arranged in rows and columns, each of the memory cell units being constituted of a plurality of electrically rewritable memory cells connected to each other, the memory cell units having selective transistors at one ends, respectively;

a plurality of bit lines arranged in parallel substantially in a column direction, each of the bit lines being connected to corresponding memory cell units at the one ends of the memory cell units; and a selective gate line connected to a gate of the selective transistors, the non-volatile semiconductor memory device executing an operation wherein, during data writing operation of writing data in at least selected one of the memory cells constituting at least selected one of the memory cell units connected to at least selected one of the bit lines, after transferring voltages of the bit lines to the memory cell units through the selective transistors, a voltage of the selective gate line is set higher than a power supply voltage and a voltage of a semiconductor substrate surface on which the memory cell array is formed is set lower than a ground potential to cut off at least a part of the selective transistors.

18. The non-volatile semiconductor memory device according to claim 17, wherein a voltage of a non-write bit line among the bit lines is set higher than the power supply voltage.

19. A non-volatile semiconductor memory device comprising:

a semiconductor substrate;

a memory cell array formed on the semiconductor substrate, the memory cell array comprising a plurality of memory cell units arranged in rows and columns, each of the memory cell units being constituted of a plurality of electrically rewritable memory cells connected to each other, each of the memory cell units having a first selective transistor at one end;

a plurality of data lines arranged in parallel substantially in a column direction, each of the data lines being connected to corresponding memory cell units at the one end of each of the memory cell units;

a selective gate line connected to a gate of the first selective transistor; and a substrate potential controller for setting a voltage of the semiconductor substrate as a negative voltage, the non-volatile semiconductor memory device executing an operation wherein a select data line among the data lines is applied with a voltage insufficient for cutting off the first selective transistor, and a non-select data line among the data lines is applied with a voltage for cutting off the first selective transistor to simultaneously write a plurality of data in the memory cells.

20. The non-volatile semiconductor memory device according to claim 19, wherein the memory cells constituting each of the memory cell units are connected in series to constitute a NAND type memory cell.

* * * * *